United States Patent
Yoshida

(10) Patent No.: US 8,614,756 B2
(45) Date of Patent: Dec. 24, 2013

(54) AD CONVERTING CIRCUIT, PHOTOELECTRIC CONVERTING APPARATUS, IMAGE PICKUP SYSTEM, AND DRIVING METHOD FOR AD CONVERTING CIRCUIT

(75) Inventor: Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 13/421,658

(22) Filed: Mar. 15, 2012

(65) Prior Publication Data

US 2012/0242878 A1    Sep. 27, 2012

(30) Foreign Application Priority Data

Mar. 22, 2011    (JP) .................................. 2011-062463

(51) Int. Cl.
*H04N 3/14* (2006.01)
*H03M 1/12* (2006.01)
*H03M 1/36* (2006.01)
*H01L 29/00* (2006.01)
*H01L 31/062* (2012.01)
*H01L 27/00* (2006.01)

(52) U.S. Cl.
USPC ........... 348/300; 348/301; 348/302; 341/158; 341/159; 341/185; 257/257; 257/291; 250/208.1

(58) Field of Classification Search
USPC .......................... 348/294–324, 248, 241, 243; 250/208.1; 257/257, 291, 293, 83, 80, 257/113, 444, 462; 341/158, 155, 159, 185, 341/156, 161, 163
See application file for complete search history.

(56) References Cited

U.S. PATENT DOCUMENTS

2006/0176205 A1* 8/2006 Kawahito .................. 341/155
2009/0244328 A1* 10/2009 Yamashita ................. 348/241

FOREIGN PATENT DOCUMENTS

JP    2004-304413 A    10/2004

\* cited by examiner

*Primary Examiner* — Nhan T Tran
*Assistant Examiner* — Marly Camargo
(74) *Attorney, Agent, or Firm* — Canon U.S.A., Inc. IP Division

(57) ABSTRACT

An apparatus for acquiring an i-bit digital code by a first stage AD conversion and a j-bit digital code by a second stage AD conversion includes a comparing unit which compares a reference signal and an analog signal in the first stage AD conversion; and an amplifying unit for outputting an amplified residual signal acquired by amplifying a difference between the analog signal and an analog signal corresponding to the i-bit digital code. The comparing unit compares the amplified residual signal and the reference signal in the second stage AD conversion.

13 Claims, 11 Drawing Sheets

US 8,614,756 B2

AD CONVERTING CIRCUIT, PHOTOELECTRIC CONVERTING APPARATUS, IMAGE PICKUP SYSTEM, AND DRIVING METHOD FOR AD CONVERTING CIRCUIT

BACKGROUND OF THE INVENTION

1. Field of the Invention

The present invention relates to AD converting circuits, photoelectric converting apparatuses using them, image pickup systems, and driving methods for AD converting circuits. In particular, it relates to one configured to AD convert an input signal by performing an operation of comparing a gradually changing reference signal and the input signal a plurality of number of times.

2. Description of the Related Art

Solid-state image pickup devices have often been used in digital cameras and digital videos. A solid-state image pickup device has, on one chip, a plurality of pixels and a plurality of AD converting circuits which convert analog signals output from the plurality of pixels to digital signals. Several techniques have been proposed for the architectures of the AD converting circuits.

Japanese Patent Laid-Open No. 2004-304413 performs N-bit AD conversion on analog signals output from pixels, amplifies the residual signals, and then performs M-bit AD conversion on the amplified residual signal. The AD conversion in two stages allows AD conversion of (N+M) bit resolution.

However, the configuration of Japanese Patent Laid-Open No. 2004-304413 has a problem of an increase of the circuit scale because separate AD converting circuits are provided for the AD conversions of the first stage and the second stage.

SUMMARY OF THE INVENTION

An apparatus for acquiring an i-bit digital code by a first stage AD conversion and a j-bit digital code by a second stage AD conversion according to the present invention includes a comparing unit which compares a reference signal and an analog signal in the first stage AD conversion, and an amplifying unit which outputs an amplified residual signal which is acquired by amplifying a difference between the analog signal and an analog signal corresponding to the i-bit digital code. The i and j each is an integer equal to or greater than 2. The comparing unit compares the amplified residual signal and the reference signal in the second stage AD conversion.

An apparatus according to the present invention includes a comparing unit, an amplifying unit, a counter which counts in a plurality of bits, and a memory. In this case, the memory holds a count value of the counter at a time when a magnitude relationship between a reference signal and an analog signal compared in the comparing unit is inverted. The amplifying unit outputs a residual signal acquired by amplifying a difference between the analog signal and the reference signal when the magnitude relationship between the reference signal and the analog signal is inverted. The memory further holds the count value of the counter at a time when the magnitude relationship between the reference signal and the residual signal compared by the comparing unit is inverted.

A driving method according to the present invention for an apparatus having an amplifying unit, and a comparing unit. The method includes a first step of comparing an analog signal and a reference signal by the comparing unit to acquire an i-bit digital code (where i is an integer that equal to or greater than 2), a second step of amplifying the difference signal between a reference signal corresponding to the i-bit digital code and the analog signal by the amplifying unit, and a third step of comparing the amplified difference signal and the reference signal by the comparing unit to acquire a j-bit digital code (where j is an integer equal to or greater than 2).

Further features of the present invention will become apparent from the following description of exemplary embodiments with reference to the attached drawings.

DESCRIPTION OF THE EMBODIMENTS

First Embodiment

With reference to drawings, an AD converting circuit according to a first embodiment of the present invention will be described. According to the first embodiment, a photoelectric converting apparatus having a plurality of columns of pixels includes an AD converting circuit provided for each of the columns of pixels. In other words, an AD converting circuit is applied to a column ADC configuration.

Figure 1:
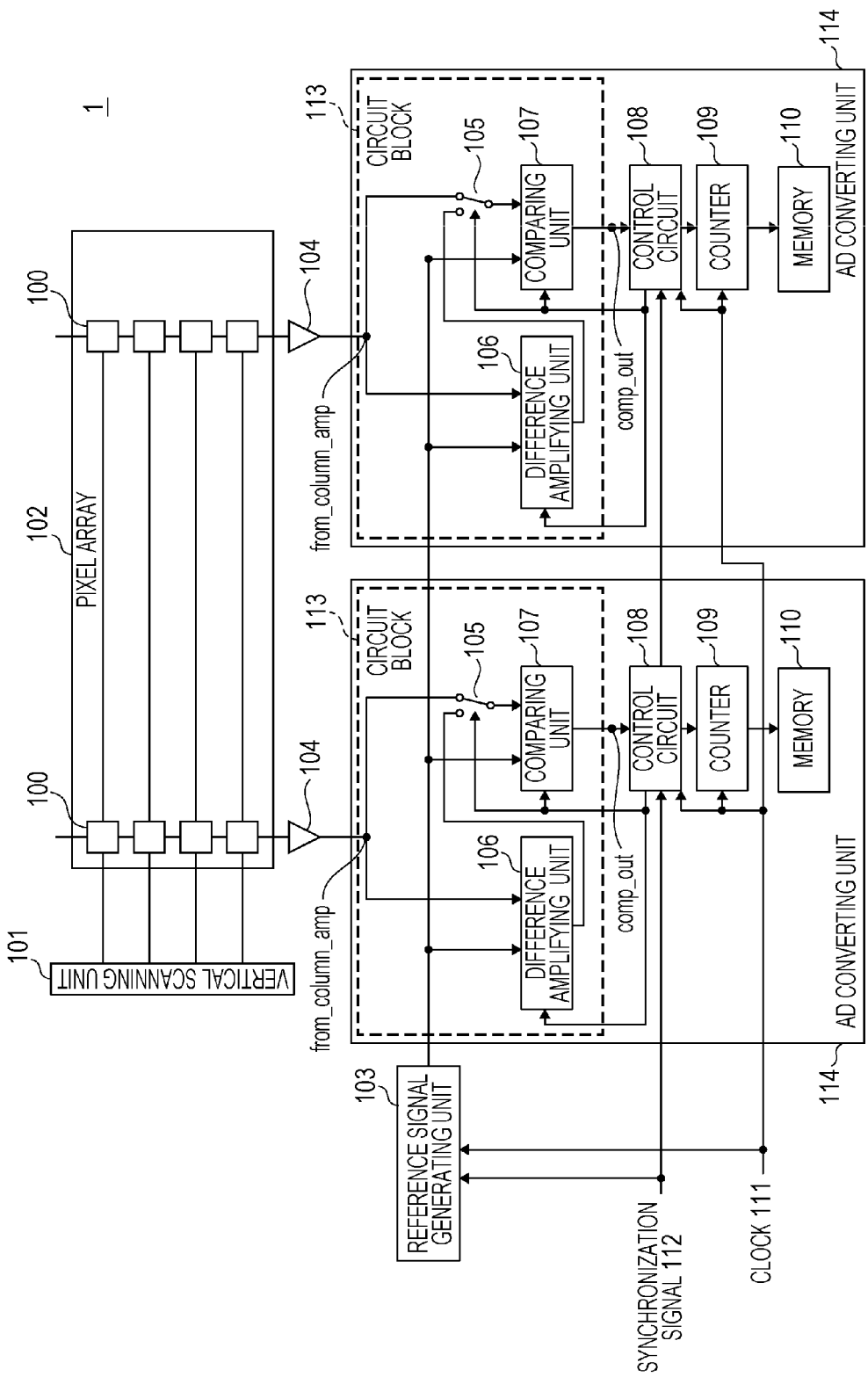
FIG. 1 is a block diagram illustrating a configuration of a photoelectric converting apparatus according to the present invention.

FIG. 1 is a block diagram illustrating an exemplary configuration of a photoelectric converting apparatus 1. The photoelectric converting apparatus 1 has a pixel array 102 having pixels 100 arranged in a matrix. A plurality of pixels 100 provided for one column output analog signals to a common column signal line VL. A vertical scanning unit 101 controls the pixels 100 in rows and outputs a signal relating to an operation of the pixels. A column amplifying unit 104 is provided correspondingly to the column signal line VL and has a function of amplifying a signal output to the corresponding column signal line VL. The column amplifying unit 104 may be a gain-variable amplifier. A signal output from the column amplifying unit 104 is input to the AD converting unit 114 and is converted to a digital signal. The S/N ratio may be improved by a noise reduction circuit in a foregoing stage of the column amplifying unit 104, not illustrated, which reduces noise caused in the pixels 100.

The AD converting unit 114 includes a circuit block 113, a control circuit 108, and a memory 110. The circuit block 113 has a function of comparing an analog signal from a column amplifying unit and a reference signal given from the reference signal generating unit 103 and a function of amplifying a residual as a result of the comparison by the comparison function. The control circuit 108 controls operations of the memory 110 and circuit block 113 in response to an output from the circuit block 113. The control circuit 108 in each of the columns operates in response to a common clock signal 111 or synchronization signal 112 from outside, not illustrated. In an AD conversion operation, a counter 109 starts a counting operation in synchronism with the transition start of a reference signal which is supplied from the reference signal generating unit 103 and sequentially changes. When the output of a comparator included in the circuit block 113 inverts, that is, when the magnitude relationship between a reference signal and an analog signal inverts, the control circuit 108 holds the count value of the counter 109 at that time in the memory 110. The counter 109 counts with a plurality of bits, and the memory 110 holds a count value of a plurality of bits.

Figure 2:
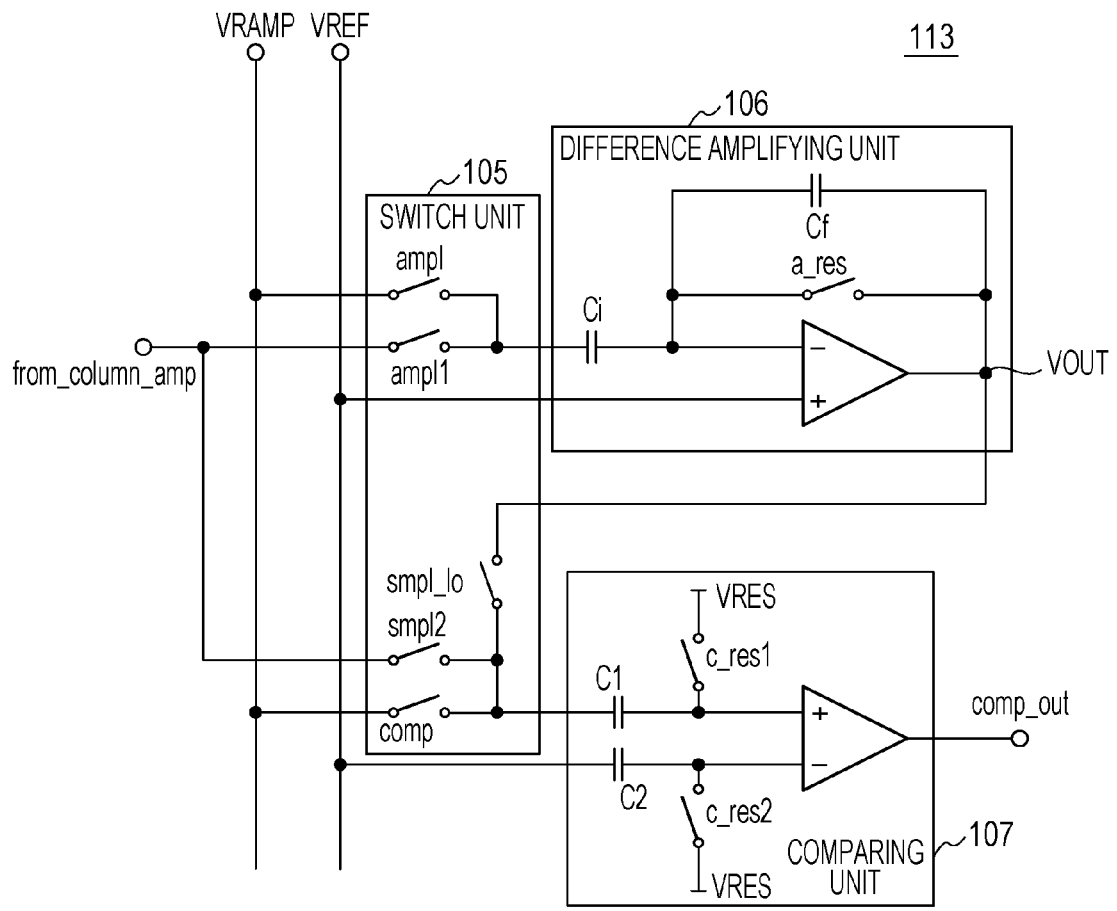
FIG. 2 is a circuit diagram illustrating a configuration of a circuit block according to a first embodiment.

FIG. 2 illustrates a configuration of the circuit block 113 according to the present embodiment. The circuit block 113 includes a difference amplifying unit 106, a comparing unit 107, and a switch unit 105. The letter symbols given to the switches refer to signals which control ON/OFF of the corresponding switches.

The difference amplifying unit 106 includes a differential amplifier, a sampling capacitance Ci, a feedback capacitance Cf, and a feedback switch a_res. A reference voltage VREF is given to a non-inverting input terminal of the differential amplifier. The reference voltage VREF is a fixed voltage in this case. On the other hand, the inverting input terminal of the differential amplifier is commonly connected to one terminal of the sampling capacitance Ci, one terminal of the feedback capacitance Cf, and one terminal of the feedback switch a_res. The output terminal of the differential amplifier is commonly connected to the other terminal of the feedback capacitance Cf and the other terminal of the feedback switch. The other terminal of the sampling capacitance Ci is configured to commonly connect through a switch ampl to an input terminal which receives a reference signal VRAMP supplied from a reference signal generating unit and through a switch smpl 1 to a from_column_amp which is an output terminal of the column amplifying unit 104.

The comparing unit 107 includes a differential amplifier, input capacitances C1 and C2, and reset switches c_res1 and c_res2. The reset switches c_res1 and c_res2 are controlled by a common signal c_res. The switch unit 105 includes a plurality of switches for switching a signal to be input to the difference amplifying unit 106 and comparing unit 107. A non-inverting input terminal of the differential amplifier is commonly connected to one terminal of the input capacitance C1 and one terminal of the switch c_res1. The other terminal of the switch c_res1 receives a reset voltage VRES which is a reference voltage. The reset voltage VRES may have a GND level, for example. The output terminal of the differential amplifier as an output terminal of the comparing unit 107 is connected to the control circuit 108. The other terminal of the input capacitance C1 is connected through a switch comp to an input terminal which receives a reference signal VRAMP, through a switch smpl 2 to a from_column_amp terminal, and through a switch smpl_lo to an output terminal of the difference amplifying unit 106. The switch smpl 2 is controlled by a common signal smpl to the switch smpl 1. On the other hand, an inverting input terminal of the differential amplifier is commonly connected to one terminal of the input capacitance C2 and one terminal of the switch c_res2. The other terminal of the switch c_res2 receives a reset voltage VRES like the switch c_res1. The other terminal of the input capacitance C2 receives a power supply voltage VREF.

Figure 3:
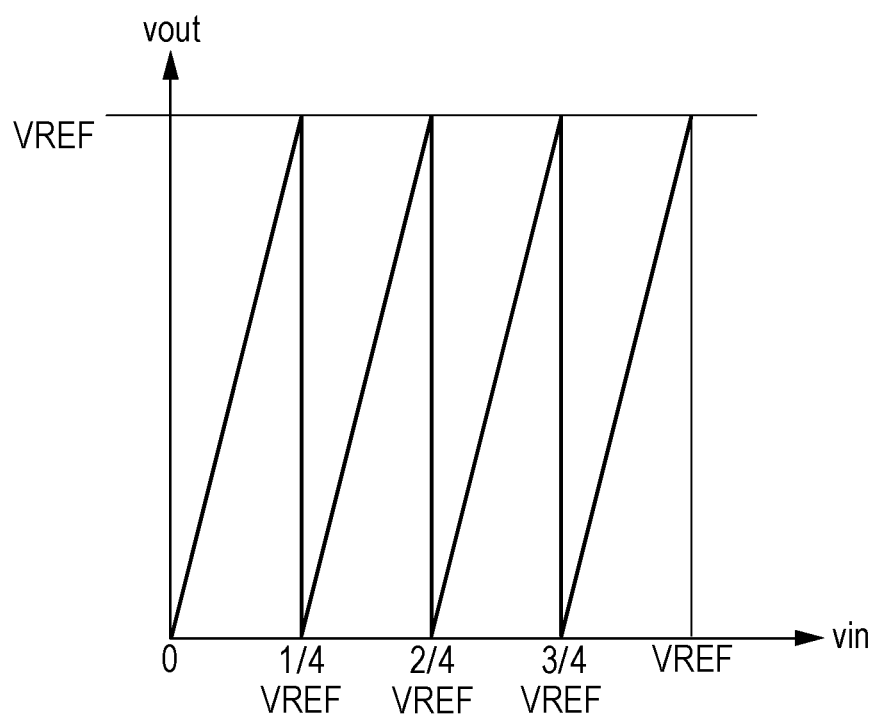
FIG. 3 illustrates an input/output characteristic of a difference amplifying unit according to the first embodiment.

According to the present embodiment, an analog signal undergoes AD conversion in two stages. The first stage, that is, higher-order bit conversion is performed with 2 bits, and the second stage, that is, lower-order bit conversion is performed with 2 bits. FIG. 3 illustrates an input/output characteristic of the difference amplifying unit 106 to higher-order bit conversion. The horizontal axis indicates input voltage Vin, and the vertical axis indicates output voltage Vout. In the range from 0 V to the power supply voltage VREF, every $(1/4) \times$ VREF of the input voltage Vin results in the output voltage, that is, the residual signal of 0.

Because the gain of the difference amplifying unit 106 according to the present embodiment is set to four times, the ratio in capacitance value between the sampling capacitance Ci and the feedback capacitance Cf is:

$$Ci/Cf=4 \qquad (1)$$

Next, with further reference to the timing chart illustrated in FIG. 4, AD conversion operations according to the present embodiment will be described. The AD conversion operations are roughly divided into an operation in a sampling period, an operation in a higher-order bit conversion period, and an operation in a lower-order bit conversion period. The following description assumes that the switches illustrated in FIG. 2 are turned on when a signal given thereto has a high level and is turned off when the signal has a low level.

First, an operation in the sampling period will be described. At a time t0, a signal from the pixel 100, which is amplified in the column amplifying unit 104 is given to a from_column_amp terminal. When signals smpl, a_res, and c_res turn to high level at the time t0, the corresponding switches smpl 1, smpl 2, feedback switch a_res, switch c_res1, and c_res2 are turned on. Thus, in the difference amplifying unit 106, both terminals of the feedback capacitance Cf are reset to a power supply voltage VREF. The difference voltage between the power supply voltage VREF and the signal from the pixel 100 amplified in the column amplifying unit 104 is given to the sampling capacitance Ci. In the comparing unit 107, the difference voltage between the reset voltage VRES and the signal from the pixel 100 amplified in the column amplifying unit 104 is given to the input capacitance C1. The reset voltage VRES and power supply voltage VREF are given to the input capacitance C2.

After signals a_res and c_res turn to a low level at a time t1, the signal smpl comes to have a low level at a time t2. Thus, the signal from the pixel 100 amplified in the column amplifying unit 104 is sampled in the sampling capacitance Ci with reference to the power supply voltage VREF. The signal from the pixel 100 amplified in the column amplifying unit 104 is held in the input capacitance C1 with reference to the power supply voltage VRES.

Next, an operation in the higher-order bit conversion period will be described. At a time t3, a signal comp turn to a high level, and a reference signal VRAMP is given to the other terminal of the input capacitance C1. At the same time, when the reference signal VRAMP starts transition, the counter 109 starts a counting operation in synchronism with that. According to the present embodiment, because higher-order bit conversion is performed in 2 bits, the reference signal VRAMP shifts in four stages within the higher-order bit conversion period.

It is assumed that the output from the column amplifying unit 104 turn to a level Vi represented by "input signal level". When the reference signal VRAMP has a higher level than the input signal level Vi at a time t4, the output comp_out of the comparing unit 107 is inverted. In synchronism with this, the signal comp comes to have a low level, and signals c_res, ampl, and smpl_lo comes to have a high level. The control circuit 108 stores the count value of the counter 109 at that time to the memory 110 in synchronism with the inversion of the signal comp_out. Thus, digital code code_hi which is a higher-order bit conversion result may be acquired. In synchronism with the inversion of the output of the comparing unit 107, the signal ampl comes to have a high level, and the reference signal VRAMP is thus given to the other terminal of the sampling capacitance Ci. The change from the signal level ViN sampled at the time t2 is inverted and amplified, and the output voltage VOUT of the difference amplifying unit 106 comes to have a level given by Expression (2).

$$VOUT=(Ci/Cf)\times(VIN-VRAMP)+VREF \qquad (2)$$

Figure 4:
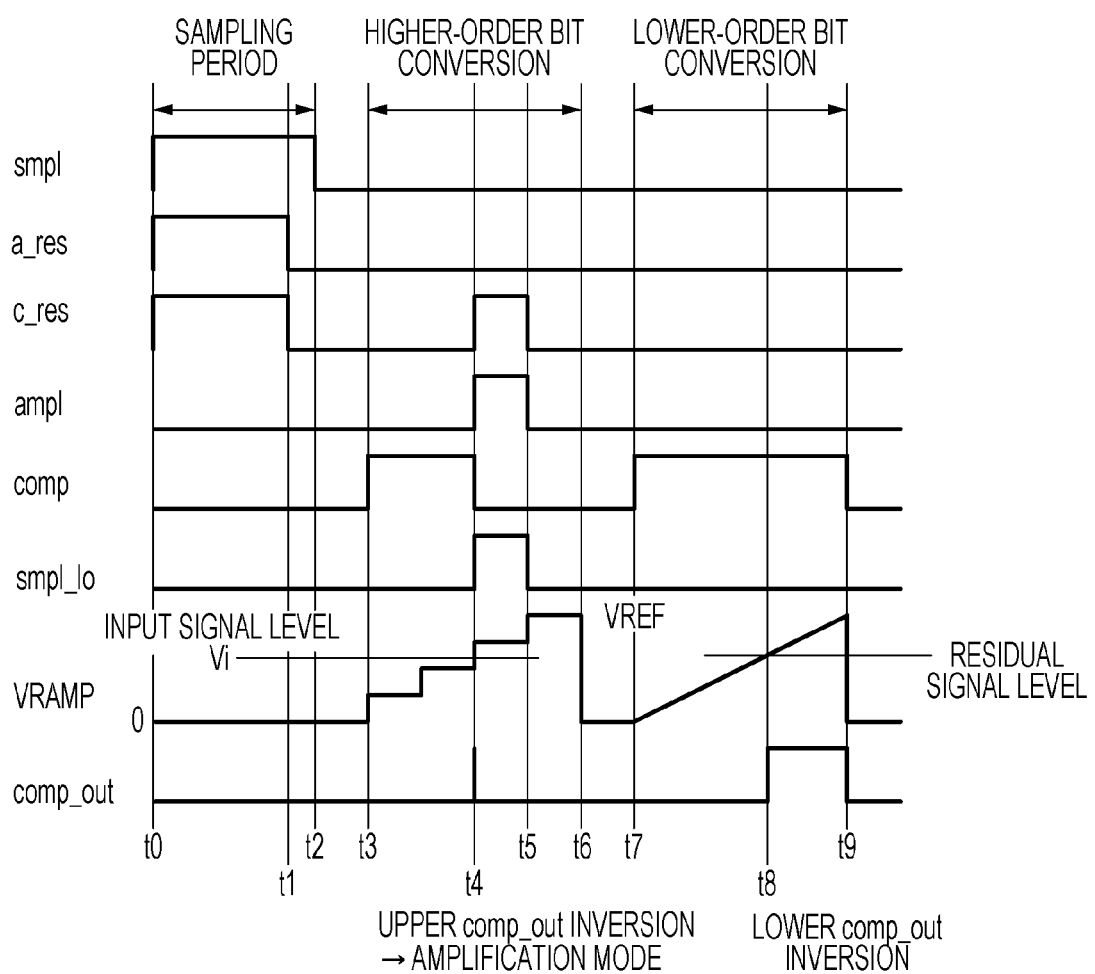
FIG. 4 is a timing chart illustrating operations by an AD converting unit according to the first embodiment and a second embodiment.

In Expression (2), (VIN−VRAMP) refers to a residual signal acquired by AD conversion of the input signal VIN in the higher-order bit conversion period and corresponds to $\Delta vi$ in FIG. 4. In other words, in Expression (2), the residual signal is indicated as being amplified with a gain of Ci/Cf (4 according to the present embodiment). The amplified residual signal acquired by Expression (2) undergoes the subsequent lower bit conversion.

When the signals smpl_lo and c_res come to have a low level at a time t5, the output voltage VOUT of Expression (2) is sampled to the input capacitance C1 with reference to the power supply voltage VRES. At a time t6 after that, the reference signal VRAMP reaches a predetermined maximum value, and the higher-order bit conversion period ends.

Next, an operation in a lower-order bit conversion period will be described. When the signal comp comes to have a high level at a time t7, the reference signal VRAMP is given to the other terminal of the input capacitance C1. The reference signal VRAMP changes with time. When the reference signal VRAMP has a higher level than that of the amplified residual signal at a time t8, the output comp_out of the comparing unit 107 is inverted. In synchronism with this, the control circuit 108 stores the count value of the counter 109 at that time to the memory 110. Thus, digital code code_lo which is a lower-order bit conversion result is acquired. At a time t9, the reference signal VRAMP reaches a predetermined maximum value, and the lower-order bit conversion period ends.

According to the present embodiment, an analog signal is converted to a digital signal in two stages. Assuming the resolution is i-bits in a first stage, that is, higher-order bit conversion, and the resolution is j-bits in a second stage, that is, lower-order bit conversion, the finally acquired digital signal is (i+j)-bits. In this case, i and j are both integers that are equal to or greater than 2. Assuming the higher-order bit conversion result is code_hi and the lower-order bit conversion result is code_lo, the finally acquired digital signal code_total is given by Expression (3).

$$code\_total=code\_hi*2^j+code\_lo \qquad (3)$$

By encoding the higher-order bit conversion result and lower-order bit conversion result as in Expression (3) in the processing circuit in a subsequent stage, not illustrated, an (i+j)-bit digital signal corresponding to the analog signal may be acquired.

According to the present embodiment, the reference signal VRAMP changes in a stepwise manner in the higher-order bit conversion period and changes in a slopewise manner in the lower-order bit conversion period. The reference signal VRAMP may change in a stepwise manner or in a slopewise manner in both of the higher and lower-order bit conversion periods. However, the combination according to the present embodiment is particularly preferable for the following reasons.

When the reference signal VRAMP changes in a slopewise manner and a transient response distorts the waveform, the residual signal which is a difference between an input signal and the reference signal may possibly have an error. In order to acquire the residual signal with high precision, the reference signal VRAMP is preferably changed in stepwise manner. Thus, in the higher-order bit conversion period which may require a residual signal for the lower-order bit conversion, the reference signal VRAMP is preferably changed in stepwise manner. On the other hand, because the lower-order bit conversion period may not require the residual signal, it may be changed in slopewise manner. In order to change the reference signal in slopewise manner, the frequency characteristic of the reference signal generating unit 103 may be set lower than the case where the reference signal is changed in stepwise manner, which may reduce power consumption. Setting the reference signal VRAMP according to the present embodiment may improve the conversion precision and reduce the power consumption.

According to the embodiment as described above, because the higher-order bit conversion and lower-order bit conversion apply one comparator, a simpler circuit configuration and higher resolution AD conversion may be implemented than before.

Second Embodiment

Figure 5:
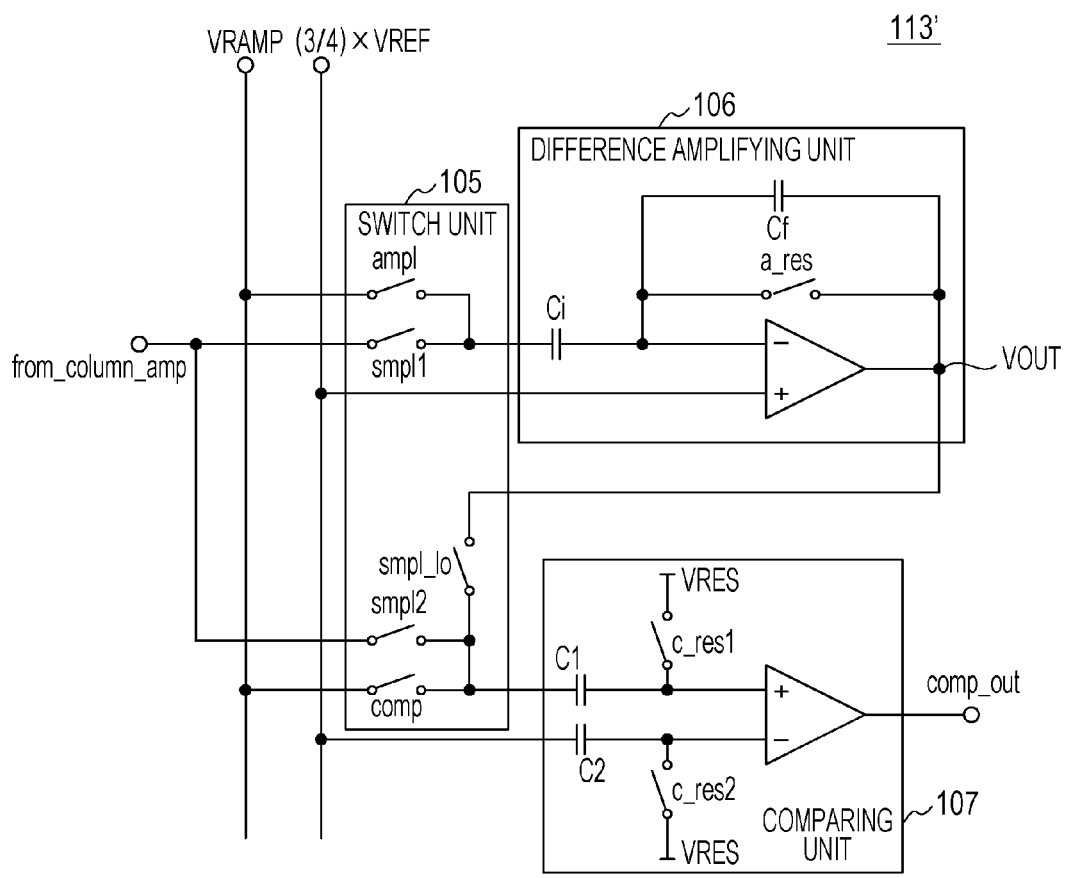
FIG. 5 is a circuit diagram illustrating a configuration of a circuit block according to the second embodiment.
Figure 6:
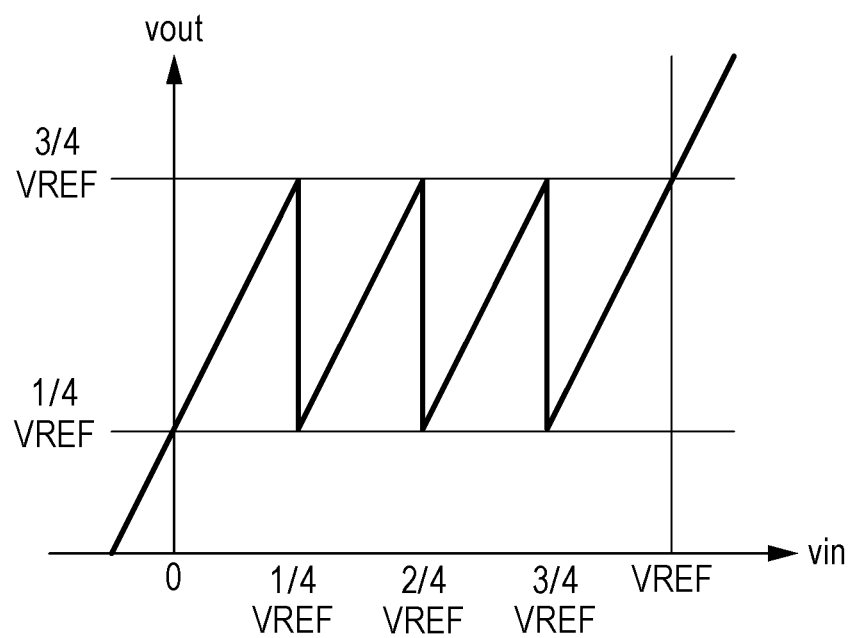
FIG. 6 illustrates an input/output characteristic of a difference amplifying unit according to the second embodiment.

With reference to FIGS. 5 and 6, a second embodiment of the present invention will be described. FIG. 5 illustrates a configuration of a circuit block 113' in an AD converting unit according to the present embodiment, which replaces the circuit block 113 according to the first embodiment.

The present embodiment is different from the first embodiment in that the reference voltage to be input to the non-inverting input terminal of a differential amplifier included in the difference amplifying unit 106 and the other terminal of the input capacitance C2 included in the comparing unit 107 is changed from VREF to (¾)×VREF. Because the remaining configuration is the same as the configuration of the circuit block 113 illustrated in FIG. 2, the description will be omitted. Because the operations are performed in timings illustrated in FIG. 4, the descriptions of the operations will be omitted.

According to the present embodiment, a reference voltage of (¾)×VREF provides a redundant bit in a higher-order bit conversion period. This will be described more specifically below.

According to the present embodiment, because the reference potential is (¾)×VREF, the output voltage of the difference amplifying unit 106 expressed in Expression (2) is changed to as in Expression (4).

$$VOUT=(Ci/Cf)\times(VIN-VRAMP)+(¾)\times VREF \qquad (4)$$

In this case, Expression (5) is satisfied.

$$(Ci/Cf)=2 \qquad (5)$$

FIG. 6 illustrates an input/output characteristic of the difference amplifying unit 106. In FIG. 6, in the range of input voltages from 0 to VREF, the output voltage VOUT representing the residual signal caused by a higher-order bit conversion is (¾)×VREF every (¼)×VREF of the input voltage. According to the present embodiment, the residual signal is changed from (¼)×VREF to a range of (¾)×VREF unlike the first embodiment.

Setting an error correction redundant bit allows the correction of the offset occurring in the comparing unit 107 even it is over the range.

More generalized AD conversion in two stages according to the present embodiment will be described. Assuming the resolution is i-bits in a first stage, that is, higher-order bit conversion and the resolution is j-bits in a second stage, that is, lower-order bit conversion, the finally acquired digital signal is (i+j−1)-bits. In this case, i and j are both integers that are equal to or higher than 2. Assuming the higher-order bit conversion result is code_hi and the lower-order bit conversion result is code_lo, the finally acquired digital signal code_total is given by Expression (6).

$$code\_total = code\_hi * 2^{(j-1)} + code\_lo \quad (6)$$

According to the present embodiment, in addition to the advantage acquired by the first embodiment, the offset occurring in the comparing unit 107, for example, may be corrected, and AD conversion with high precision may be implemented.

Third Embodiment

Figure 7:
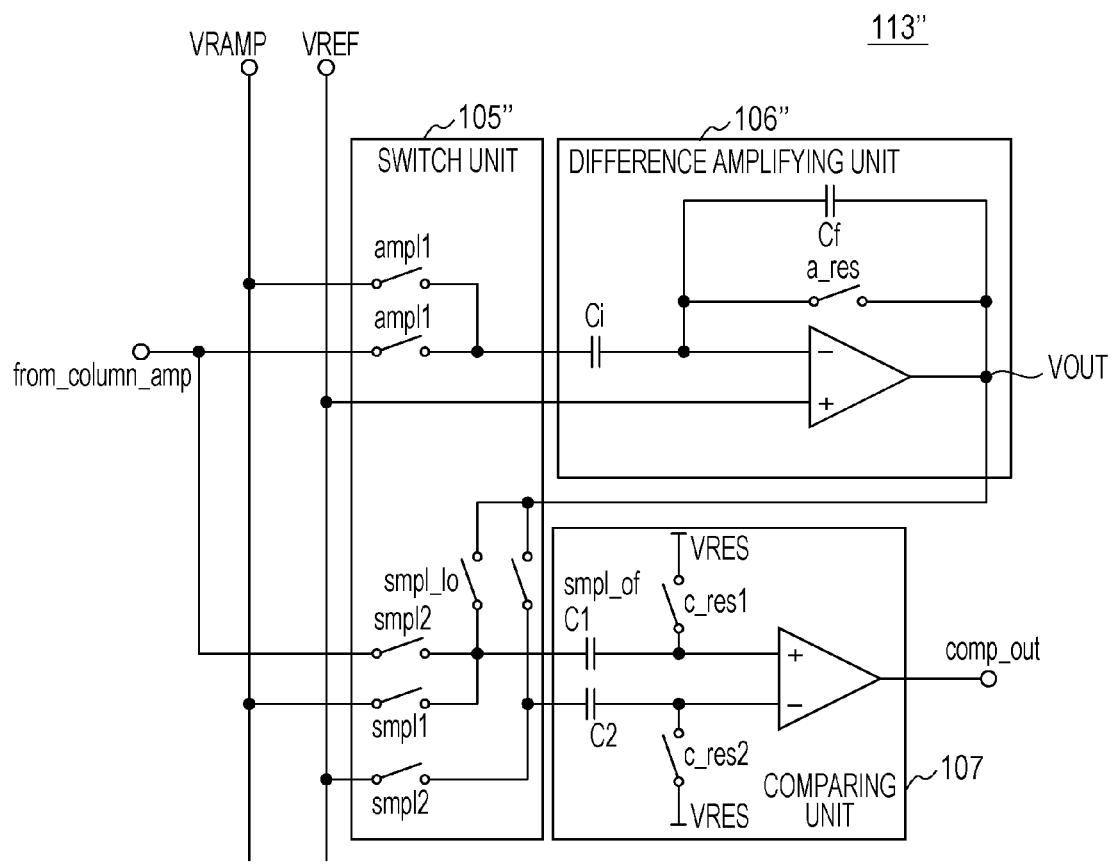
FIG. 7 is a circuit diagram illustrating a configuration of a circuit block according to a third embodiment.
Figure 8:
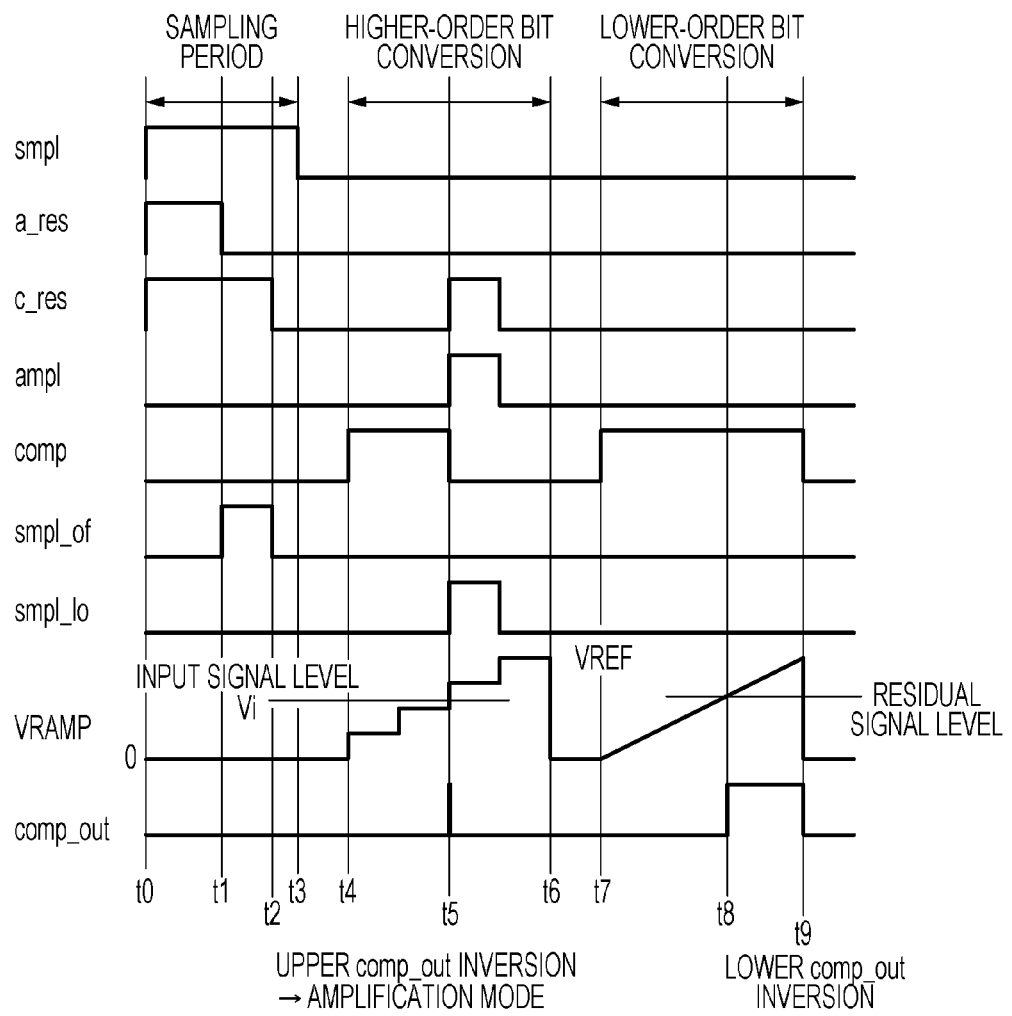
FIG. 8 is a timing chart illustrating operations by an AD converting unit according to the third embodiment.

With reference to drawings, a third embodiment of the present invention will be described. FIG. 7 illustrates a configuration of a circuit block 113" in an AD converting unit according to the present embodiment, which replaces the circuit block 113 according to the first embodiment. FIG. 8 is a timing chart illustrating operations according to the present embodiment. The differences from the first embodiment will mainly be described below. According to the present embodiment, AD conversion may be performed under a condition where the offset signal occurring in a difference amplifying unit is cancelled.

The circuit block 113" is different from the circuit block 113 illustrated in FIG. 2 in the configurations of the switch unit 105 and difference amplifying unit 106. The circuit block 113" includes a switch unit 105", a difference amplifying unit 106", and a comparing unit 107. The letter symbols given to the switches refer to signals which control ON/OFF of the corresponding switches.

The difference amplifying unit 106" includes a differential amplifier, a sampling capacitance Ci, a feedback capacitance Cf, and a feedback switch a_res. A power supply voltage VREF is given to a non-inverting input terminal of the differential amplifier, the power supply voltage VREF being a fixed voltage in this case. On the other hand, the inverting input terminal of the differential amplifier is commonly connected to one terminal of the sampling capacitance Ci, one terminal of a first feedback capacitance Cf, and one terminal of the feedback switch a_res. The output terminal of the differential amplifier is commonly connected to the other terminal of the e feedback switch a_res and the other terminal of the feedback capacitance Cf. The other terminal of the sampling capacitance Ci is connected through a switch ampl 1 to a reference signal VRAMP supplied from a reference signal generating unit and through a switch smpl 1 to an output of the column amplifying unit 104.

The output terminal of the difference amplifying unit 106" is connected to the other terminal of the input capacitance C1 through a switch smpl_lo and is connected to the other terminal of the input capacitance C2 through a switch smpl_of. The other terminal of the input capacitance C1 is further connected to the output from_column_amp of the column amplifying unit 104 through the switch smpl 2 and is connected to the input terminal which receives a reference signal VRAMP through a switch comp 1. The other terminal of the input capacitance C2 is connected to a power supply voltage VREF through a switch comp 2.

In the configuration in FIG. 7, the switch ampl 1 and ampl 2 are controlled by a common signal ampl. The switches smpl 1 and smpl 2 are controlled by a common signal smpl. Similarly, the switches comp 1 and comp 2 are controlled by a common signal comp.

Next, with further reference to the timing chart illustrated in FIG. 8, AD conversion operations according to the present embodiment will be described. Also according to the present embodiment, like the first embodiment, an analog signal undergoes AD conversion in two stages, and higher-order bit and lower-order bit conversions are performed with 2 bits. Because the gain of the difference amplifying unit 106" is set to four times, the ratio in capacitance value between the sampling capacitance Ci and the feedback capacitance Cf may be expressed by Expression (1) above. The following description assumes that the switches illustrated in FIG. 7 are turned on when a signal given thereto has a high level and is turned off when the signal has a low level.

First, an operation in the sampling period will be described. At a time t0, a signal from the pixel 100, which is amplified in the column amplifying unit 104 is given to a from_column_amp terminal. When signals smpl, a_res, and c_res turn to a high level at the time t0, the corresponding switches smpl 1, smpl 2, feedback switch a_res, switch c_res1, and c_res2 are turned on. Thus, in the difference amplifying unit 106", both terminals of the feedback capacitance Cf are reset to a power supply voltage VREF. The reference voltage Vref_amp and the signal from the pixel 100 amplified in the column amplifying unit 104 are given to the sampling capacitance Ci. In the comparing unit 107, the reset voltage VRES and the signal from the pixel 100 amplified in the column amplifying unit 104 are given to the input capacitance C1. The reset voltage VRES is given to one terminal of the input capacitance C2.

When the signal a_res turns to have a low level at a time t1, a signal from the pixel 100 amplified in the column amplifying unit 104 is held in the sampling capacitance Ci with reference to the power supply voltage VREF. At the same time, the power supply voltage VREF is held in the feedback capacitance Cf. At the time t1, the signal smpl_of comes to have a high level, and the offset of the difference amplifying unit 106" is given to the other terminal of the input capacitance C2. When the signals smpl_of and c_res come to have a low level at the time t2, the offset of the difference amplifying unit 106" is held in the input capacitance C2 with reference to the power supply voltage VRES. At the time t3, the signal smpl comes to have a low level, the other terminal of the sampling capacitance Ci and the other terminal of the input capacitance C1 comes to have an electrically floating state.

Because the subsequent operations are the same as the operations according to the first embodiment, the description will be omitted.

According to the present embodiment, in addition to the advantage acquired by the first embodiment, AD conversion may be performed with a reduced offset occurring in the difference amplifying unit 106". According to the present embodiment, because the offset in the difference amplifying unit 106" is sampled in the comparing unit 107, the offset may be reduced in an analog region when the comparison operation is performed in the comparing unit 107. Because the difference amplifying unit 106" has a unique offset, an image acquired by using a photoelectric converting apparatus has an offset appearing as a line. The configuration of the present embodiment may contribute to improved image quality.

Fourth Embodiment

Figure 9:
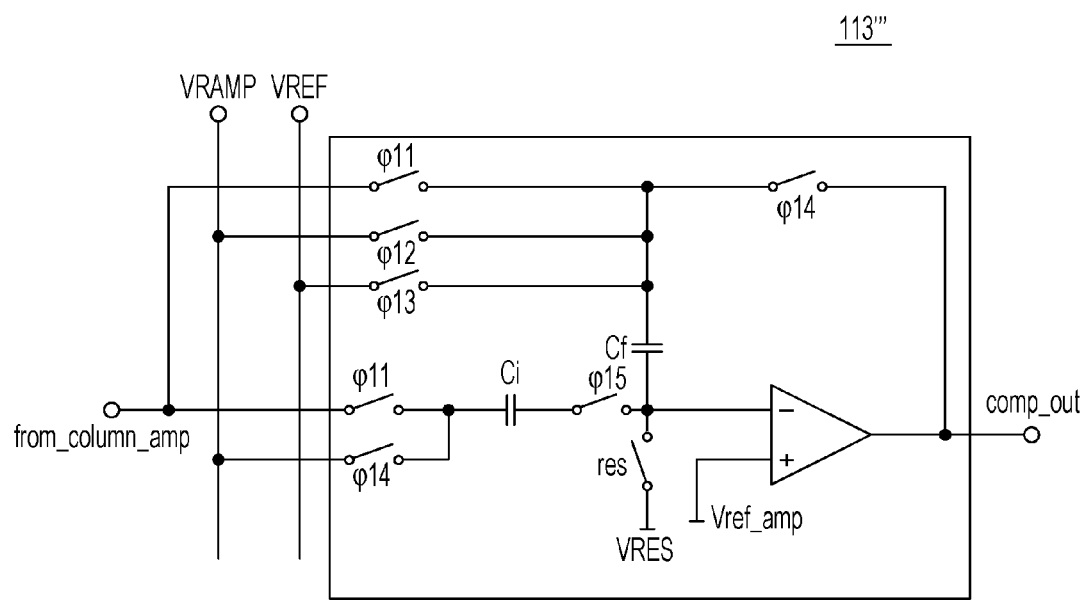
FIG. 9 is a circuit diagram illustrating a configuration of a circuit block according to a fourth embodiment.
Figure 10:
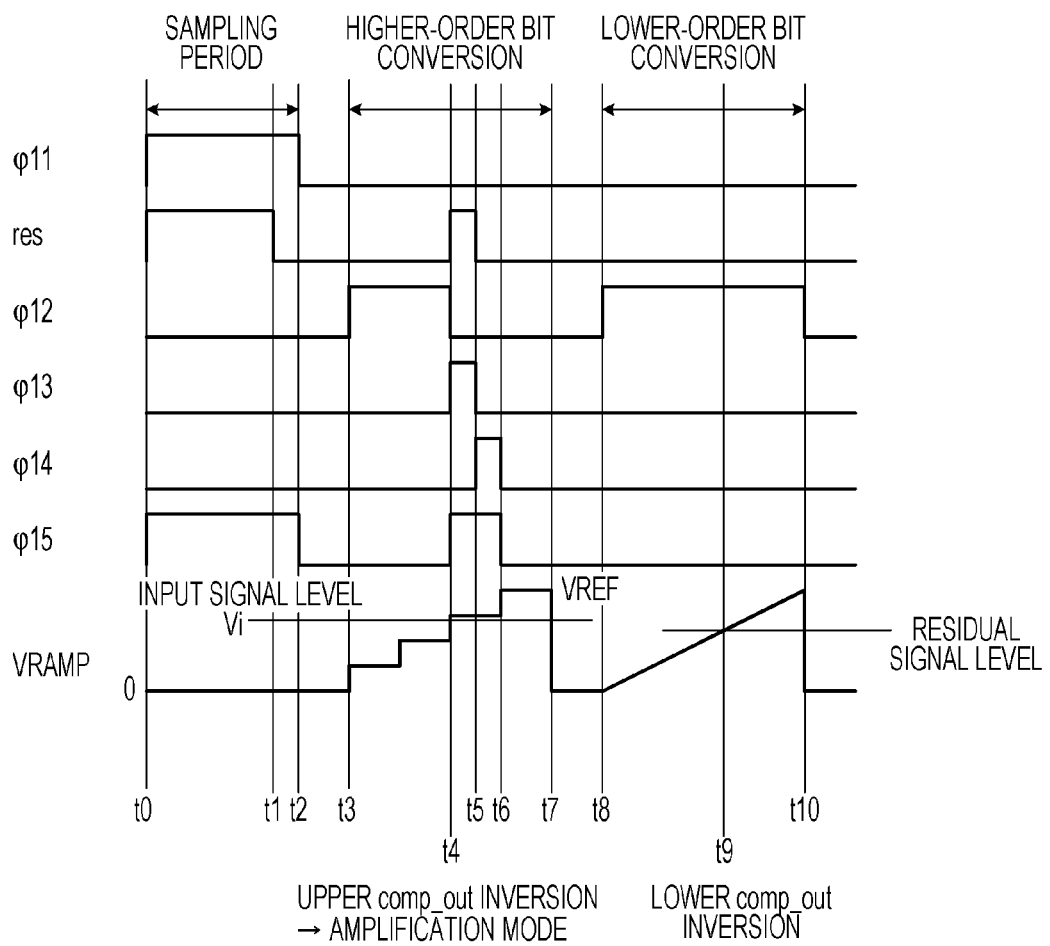
FIG. 10 is a timing chart illustrating operations by an AD converting unit according to the fourth embodiment.

With reference to drawings, a fourth embodiment of the present invention will be described. FIG. 9 illustrates a configuration of a circuit block 113''' in an AD converting unit according to the present embodiment, which replaces the circuit block 113 according to the first embodiment. The differences from the first embodiment will mainly be described below. FIG. 10 is a timing chart illustrating operations according to the present embodiment. According to the aforementioned embodiments, each of the difference amplifying unit and the comparing unit has a differential amplifier. On the other hand, according to the present embodiment, one differential amplifier functions as both of the difference amplifying unit and the comparing unit. In other words, the comparing unit and difference amplifying unit of the AD converting unit share a differential amplifier.

Referring to FIG. 9, the circuit block 113''' includes a plurality of switches, a sampling capacitance Ci, a feedback capacitance Cf, and a differential amplifier. A reference voltage Vref_amp is connected to a non-inverting input terminal of the differential amplifier. An inverting input terminal is connected to one terminal of the sampling capacitance Ci through a switch (second switch) controlled with a signal φ15. The non-inverting input terminal of the differential amplifier is also connected to one terminal of the feedback capacitance Cf and is connected to a voltage source, not illustrated, which supplies a reset voltage VRES that is a first reference voltage, through a switch (first switch) controlled with a signal res. The output terminal of the differential amplifier is connected to the other terminal of the feedback capacitance Cf through a switch (third switch) controlled with a signal φ14.

The other terminal of the sampling capacitance Ci is connected to a terminal from_column_amp through a switch (seventh switch) controlled with a signal φ11 and is connected to an input terminal which receives a reference signal VRAMP through a switch (eighth switch) controlled with a signal φ14.

The other terminal of the feedback capacitance Cf is connected to a terminal from_column_amp through a switch (fourth switch) controlled with a signal φ11. The other terminal of the feedback capacitance Cf is connected to an input terminal which receives a reference signal VRAMP through a switch (fifth switch) controlled with a signal φ12 and is connected to a voltage source, not illustrated, which supplies a power supply voltage VREF through a switch (sixth switch) controlled with a signal φ13. The power supply voltage VREF is a fixed potential in this case.

Next, with reference to the timing chart illustrated in FIG. 10, AD conversion operations according to the present embodiment will be described. Also according to the present embodiment, like the first embodiment, an analog signal undergoes AD conversion in two stages, and higher-order bit and lower-order bit conversions are performed with 2 bits. Because the gain of the circuit block 113''' in an amplification mode is set to four times, the ratio in capacitance value between the sampling capacitance Ci and the feedback capacitance Cf may be expressed by Expression (1) above. The following description assumes that the switches illustrated in FIG. 9 are turned on when a signal given thereto has a high level and is turned off when the signal has a low level.

At a time t0, the signals φ11, res, and φ15 come to have a high level, and the corresponding switches are turned on. Thus, a potential difference between a signal from a pixel, which is amplified by the column amplifying unit 104, and the reset voltage VRES is given to both of the sampling capacitance Ci and feedback capacitance Cf.

Before a time t2, the signals res, φ11 and φ15 come to have a low level, and the corresponding switches are turned off. Thus, the potential difference given at the time t0 is held in the sampling capacitance Ci and feedback capacitance Cf.

Next, an operation in a higher-order bit conversion period will be described. When the signal φ12 come to a high level at a time t3, the reference signal VRAMP is given to the other terminal of the feedback capacitance Cf. Because the signal φ14 has a low level in this case, the differential amplifier has an open loop state in which the output is not fed back and operates as a comparator. The reference signal VRAMP starts transition from the time t3 and the counter 109 starts a counting operation in synchronism with that. According to the present embodiment, because the higher-order bit conversion is performed with 2 bits, the reference signal VRAMP shifts in four stages within the higher-order bit conversion period.

A signal held in the feedback capacitance in a sampling period is assumed as a level Vi represented by "INPUT SIGNAL LEVEL". When the reference signal VRAMP exceeds the input signal level Vi at a time t4, the output comp_out of the differential amplifier which operates as a comparator inverts. In synchronization of the inversion of the signal comp_out, the control circuit 108 stores the count value of the counter 109 at that time to the memory 110. Thus, digital code code_hi which is a higher-order bit conversion result may be acquired.

At the time t4, the signal φ12 comes to have a low level, and the signals φ13 and φ15 come to have a high level. This connects one terminal of the input capacitance Ci to one terminal of the feedback capacitance Cf and the other terminal of the feedback capacitance Cf to the power supply voltage VREF.

At the time t5, the signal φ13 comes to have a low level while the signal φ14 comes to have a high level. This causes the differential amplifier to have a closed loop state in which feedback capacitance Cf feeds back and operate as a differential amplifier which amplifies with reference to the reference voltage Vref_amp. The ratio in capacitance value between the sampling capacitance Ci and the feedback capacitance Cf and the input/output characteristic are as expressed in Expressions (1) and (2). In other words, an amplified residual signal acquired by amplifying a residual signal acquired in a higher-order bit conversion period with a quadruple gain is held in the feedback capacitance Cf.

Subsequently, at a time t6, the signals φ14 and φ15 come to have a low level, the differential amplifier again operates as a comparator. At a time t7, the reference signal VRAMP is reset. The higher-order bit conversion period ends then. At a time t8, the signal φ12 comes to have a high level, the reference signal VRAMP is given to the other terminal of the feedback capacitance Cf. From the time t8, the reference signal VRAMP starts transition, and the counter 109 starts a counting operation in synchronism with that. When the reference signal VRAMP exceeds the amplified residual signal at a time t9, the output comp_out of the differential amplifier which operates as a comparator comes to have a high level, and the control circuit 108 stores the count value of the counter 109 at that time to the memory 110. Thus, digital code code_lo, which is a lower-order bit conversion result, may be acquired. At a time t10, the reference signal VRAMP reaches a predetermined maximum value. The lower-order bit conversion period ends then. The digital signal code_total finally acquired through this operation may be given by Expression (3).

According to the present embodiment, the circuit configuration may further be simplified, in addition to the advantage of the first embodiment. Particularly, because column ADC may require a circuit within a pixel pitch, the present embodiment which allows reduction of the circuit magnitude is significantly effective in column ADC.

Fifth Embodiment

Figure 11:
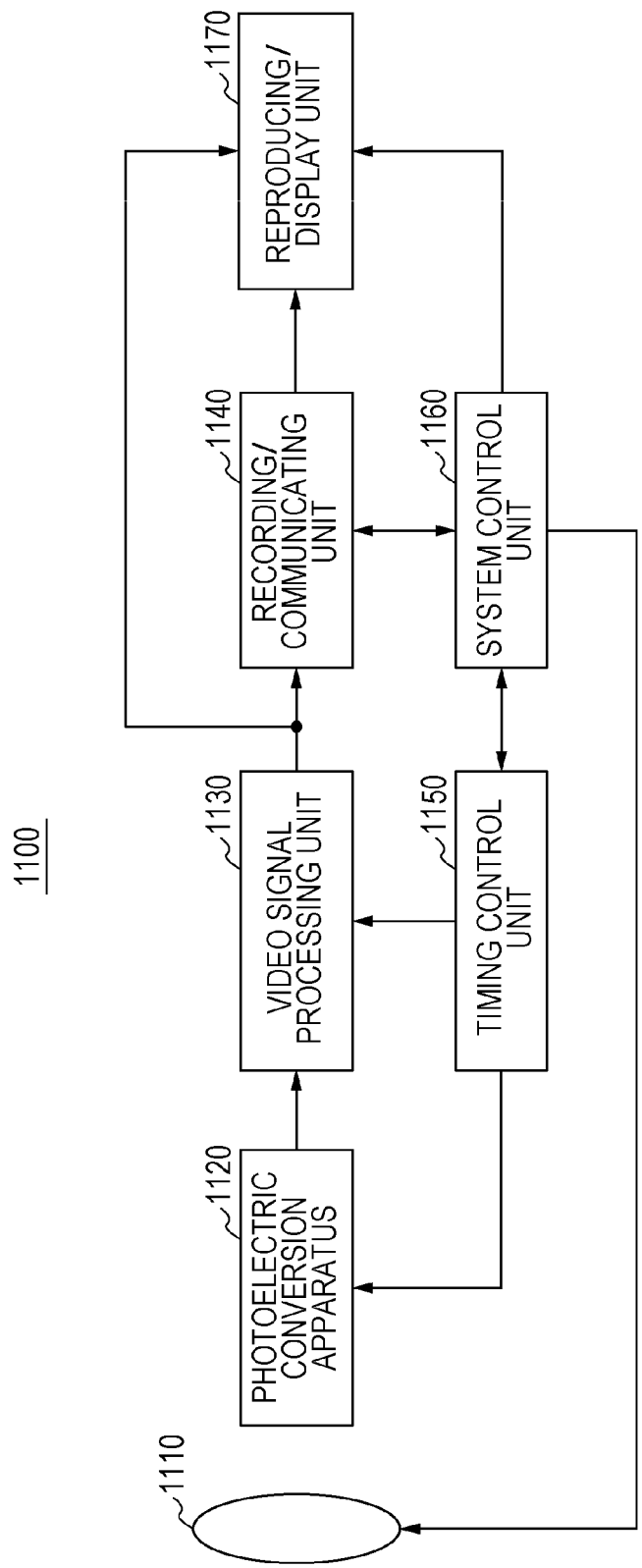
FIG. 11 is a block diagram illustrating a configuration of an image pickup system according to a fifth embodiment.

With reference to FIG. 11, an image pickup system according to a fifth embodiment of the present invention will be described.

An image pickup system 1100 may include, for example, an optical unit 1110, a photoelectric converting apparatus 1120, a video signal processing unit 1130, a recording/communicating unit 1140, a timing control unit 1150, a system control unit 1160, and a reproducing/display unit 1170. The photoelectric converting apparatus 1120 may be used in a photoelectric converting apparatus according to any one of the aforementioned embodiments.

The optical unit 1110 that is an optical system such as a lens provides light from an subject onto a pixel array of the photoelectric converting apparatus 1120 in which a plurality of pixels are aligned two-dimensionally and forms an image of the subject. The photoelectric converting apparatus 1120 outputs a signal according to the light provided to the pixel unit at the time based on a signal from the timing control unit 1150.

The signal output from the photoelectric converting apparatus 1120 is input to the video signal processing unit 1130 functioning as a processing circuit. The video signal processing unit 1130 performs processing including rearranging signals in accordance with a method determined by a program. The higher-order bit conversion result code_hi and lower-order bit conversion result code_lo generated in the AD converting unit of the photoelectric converting apparatus 1120 may be used to generate code_total in a video signal processing unit, for example. Alternatively, the photoelectric converting apparatus 1120 may have this function. The result is transmitted to the recording/communicating unit 1140 as image data generated by the processing in the video signal processing unit 1130. The recording/communicating unit 1140 transmits a signal for forming an image to the reproducing/display unit 1170 and causes the reproducing/display unit 1170 to reproduce/display a moving picture or a still picture. The recording/communicating unit in response to a signal from the video signal processing unit 1130 performs operations including communicating with the system control unit 1160 and recording a signal for forming an image in a recording medium, not illustrated.

The system control unit 1160 controls over operations of the image pickup system and controls the driving of the optical unit 1110, timing control unit 1150, recording/communicating unit 1140, and reproducing/display unit 1170. The system control unit 1160 may include a storage device, not illustrated, that is a recording medium, for example. A program for controlling operations of the image pickup system may be recorded therein. The system control unit 1160 supplies a signal for switching the driving mode in accordance with an operation by a user, for example, within the image pickup system. More specifically, it may be changing the column to be read or reset, changing the field angle with electronic zooming, and shifting the field angle with electronic image stabilizing, for example.

The timing control unit 1150 controls the driving timings for the photoelectric converting apparatus 1120 and video signal processing unit 1130 under the control of the system control unit 1160 which is a control unit.

The aforementioned embodiments have been given for illustration of modes for embodying the present invention and may be changed or combined variously without departing from the technical spirit and cope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-062463 filed Mar. 22, 2011, which is hereby incorporated by reference herein in its entirety.

What is claimed is:

1. An apparatus for acquiring an i-bit digital code by a first stage AD conversion and a j-bit digital code by a second stage AD conversion comprising:
    a comparing unit which compares a reference signal and an analog signal in the first stage AD conversion; and
    an amplifying unit which outputs an amplified residual signal acquired by amplifying a difference between the analog signal and an analog signal corresponding to the i-bit digital code, wherein:
    i and j each is an integer equal to or greater than 2, and
    the comparing unit compares the amplified residual signal and the reference signal in the second stage AD conversion.

2. The apparatus according to claim 1, wherein the amplifying unit comprises a differential amplifier.

3. The apparatus according to claim 2, wherein the amplifying unit
    further comprises a sampling capacitance and a feedback capacitance; and
    amplifies the difference between the analog signal and an analog signal corresponding to the i-bit digital code with a gain according to a ratio of capacitance value between the sampling capacitance and the feedback capacitance.

4. The apparatus according to claim 3, wherein the amplifying unit holds an offset signal of the differential amplifier in the sampling capacitance.

5. The apparatus according to claim 1, wherein the reference signal changes in a stepwise manner against time when compared with the analog signal and changes in a slopewise manner against time when compared with the residual signal.

6. The apparatus according to claim 1, wherein the j-bit digital code includes a redundant bit for error correction.

7. The apparatus according to claim 1, wherein the reference signal changes in a stepwise manner against time in the first stage AD conversion and changes in a slopewise manner against time in the second stage AD conversion.

8. A photoelectric converting apparatus comprising the apparatus according to claim 1, the photoelectric converting apparatus comprising a plurality of columns, each of the columns including a plurality of pixels for each of the columns.

9. The photoelectric converting apparatus according to claim 8, wherein a common reference signal is supplied to a plurality of AD converting circuits.

10. An image pickup system comprising:
    the photoelectric converting apparatus according to claim 8;
    an optical system which forms an image in the pixels; and
    a video signal processing unit which processes a signal output from the photoelectric converting apparatus and generates image data.

11. An apparatus comprising:
    a comparing unit;
    an amplifying unit;
    a counter which counts in a plurality of bits; and
    a memory, wherein
    the memory holds a count value of the counter at a time when a magnitude relationship between a reference signal and an analog signal compared in the comparing unit is inverted;
    the amplifying unit outputs a residual signal acquired by amplifying a difference between the analog signal and the reference signal when the magnitude relationship between the reference signal and the analog signal is inverted; and the memory further holds the count value of the counter at a time when the magnitude relationship between the reference signal and the residual signal compared by the comparing unit is inverted.

12. An apparatus comprising:
a comparing unit which compares a reference signal and an analog signal; and
an amplifying unit, wherein
the amplifying unit receives selective input of the analog signal or the reference signal; and
the comparing unit receives selective input of one of the analog signal, the reference signal, and an output of the amplifying unit, wherein:
the amplifying unit receives the analog signal or the reference signal through one capacitance; and
the comparing unit receives one of the analog signal, the reference signal, and an output of the amplifying unit through another capacitance.

13. A driving method for an apparatus having
an amplifying unit; and
a comparing unit,
the method comprising:
a first step of comparing an analog signal and a reference signal by the comparing unit to acquire an i-bit digital code (where i is an integer equal to or greater than 2);
a second step of amplifying the difference signal between a reference signal corresponding to the i-bit digital code and the analog signal by the amplifying unit; and
a third step of comparing the amplified difference signal and the reference signal by the comparing unit to acquire a j-bit digital code (where j is an integer equal to or greater than 2).

* * * * *